United States Patent
Kim

(10) Patent No.: US 9,660,094 B2
(45) Date of Patent: May 23, 2017

(54) THIN FILM TRANSISTOR AND METHOD OF MANUFACTURING THE SAME

(71) Applicant: SAMSUNG DISPLAY CO., LTD., Yongin, Gyeonggi-Do (KR)

(72) Inventor: Eun-Hyun Kim, Suwon-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/315,712

(22) Filed: Jun. 26, 2014

(65) Prior Publication Data

US 2015/0194530 A1 Jul. 9, 2015

(30) Foreign Application Priority Data

Jan. 6, 2014 (KR) .................. 10-2014-0001382

(51) Int. Cl.
*H01L 29/10* (2006.01)
*H01L 29/786* (2006.01)
*H01L 29/66* (2006.01)

(52) U.S. Cl.
CPC .... *H01L 29/7869* (2013.01); *H01L 29/66969* (2013.01); *H01L 29/78606* (2013.01); *H01L 29/78696* (2013.01)

(58) Field of Classification Search
CPC .......... H01L 29/7869; H01L 29/66795; H01L 29/44791
See application file for complete search history.

(56) References Cited

U.S. PATENT DOCUMENTS

| 7,109,069 B2 * | 9/2006 | Kokubo | H01L 27/1214 257/347 |
| 7,768,009 B2 * | 8/2010 | Kobayashi | H01L 29/04 257/350 |
| 9,029,861 B2 * | 5/2015 | Kikuchi | H01L 27/12 257/43 |
| 2003/0209737 A1 | 11/2003 | Mitani et al. | |
| 2006/0284550 A1 | 12/2006 | Takeguchi et al. | |

(Continued)

FOREIGN PATENT DOCUMENTS

| JP | 11-097701 A | 4/1999 |
| KR | 10-2012-0124292 A | 11/2012 |
| WO | WO 2013/097519 A1 | 7/2013 |

OTHER PUBLICATIONS

Choi et al., "Highly reliable multiple-channel IGZO thin-film transistors employing asymmetric spacing and channel width" in IEEE Electron Device Letters, vol. 34, p. 771. Published by IEEE in 2013.*

(Continued)

*Primary Examiner* — Jesse Y Miyoshi
*Assistant Examiner* — Tuan A Hoang
(74) *Attorney, Agent, or Firm* — Lee & Morse, P.C.

(57) ABSTRACT

A thin film transistor includes a gate electrode on a substrate, a gate insulating layer on the gate electrode, a semiconductor layer on the gate insulating layer, the semiconductor layer overlapping at least a portion of the gate electrode, a plurality of etch stoppers on the semiconductor layer, and a source electrode and a drain electrode spaced apart from each other and disposed on the etch stoppers and the semiconductor layer, wherein a plurality of channel regions are defined in the semiconductor layer by the etch stoppers on the semiconductor layer.

11 Claims, 10 Drawing Sheets

(56) References Cited

U.S. PATENT DOCUMENTS

| | | | |
|---|---|---|---|
| 2011/0147715 A1* | 6/2011 | Rogers | B82Y 10/00 257/24 |
| 2012/0045904 A1 | 2/2012 | Choi | |
| 2012/0146017 A1 | 6/2012 | Kim et al. | |
| 2014/0061815 A1* | 3/2014 | Jagannathan | H01L 27/0924 257/369 |

OTHER PUBLICATIONS

Choi et al. "Highly reliable multiple-channel IGZO thin-film transistors employing asymmetric spacing and channel width", IEEE Electron Device Letters, vol. 34, p. 771-773. Published by IEEE on May 13, 2013.*

Sung-Hwan Choi, et al.; Highly Reliable Multiple-Channel IGZO Thin-Film Transistors Employing Asymmetric Spacing and Channel Width; IEEE Electron Device Letters; vol. 34; No. 6; Jun. 2013; pp. 771-773.

* cited by examiner

THIN FILM TRANSISTOR AND METHOD OF MANUFACTURING THE SAME

CROSS-REFERENCE TO RELATED APPLICATION

Korean Patent Application No. 10-2014-0001382, filed on Jan. 6, 2014, in the Korean Intellectual Property Office, and entitled: "Thin Film Transistor And Method Of Manufacturing The Same," is incorporated by reference herein in its entirety.

BACKGROUND

1. Field

Embodiments relate to a thin film transistor and a method of manufacturing the same.

2. Description of the Related Art

With the arrival of the information age, studies on displays that can meet a variety of demands have been increasingly conducted. Examples of current displays include plasma display panel (PDP), a liquid crystal display (LCD), and an organic light emitting display (OLED). Among these, the OLED type has advantages of being lighter and thinner than PDP and LCD types, and has low power consumption.

Flexible displays in which a display device is formed on a flexible substrate are being studied. Flexible displays are not only thin and light but also flexible, such that they may be embodied in diverse forms.

SUMMARY

Embodiments are directed to a thin film transistor including a gate electrode on a substrate, a gate insulating layer on the gate electrode, a semiconductor layer on the gate insulating layer, the semiconductor layer overlapping at least a portion of the gate electrode, a plurality of etch stoppers on the semiconductor layer, and a source electrode and a drain electrode, which are spaced apart from each other and disposed on the etch stoppers and the semiconductor layer. A plurality of channel regions are defined in the semiconductor layer by the plurality of etch stoppers on the semiconductor layer.

One end portion of each etch stopper may be connected to the source electrode. An opposite end portion of each etch stopper may be connected to the drain electrode.

The channel region may be a region of the semiconductor layer that is present under the etch stopper.

The etch stopper may have a width in a range of about 5 µm to about 30 µm.

A space between the etch stoppers may be in a range of about 5 µm to about 30 µm.

The semiconductor layer may be an oxide semiconductor layer.

The oxide semiconductor layer may include at least one selected from the group of zinc (Zn), gallium (Ga), indium (In), and tin (Sn).

The oxide semiconductor layer may include indium (In), gallium (Ga), zinc (Zn), and oxygen (O).

Embodiments are also directed to a method of manufacturing a thin film transistor including forming a gate electrode on a substrate, forming a gate insulating layer covering the gate electrode, forming a semiconductor layer overlapping at least a portion of the gate electrode, forming a plurality of etch stoppers on at least a portion of the semiconductor layer, and forming a source electrode and a drain electrode spaced apart from each other and disposed on the semiconductor layer and the etch stoppers.

One end portion of the etch stopper may be connected to the source electrode. An opposite end portion of the etch stopper may be connected to the drain electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
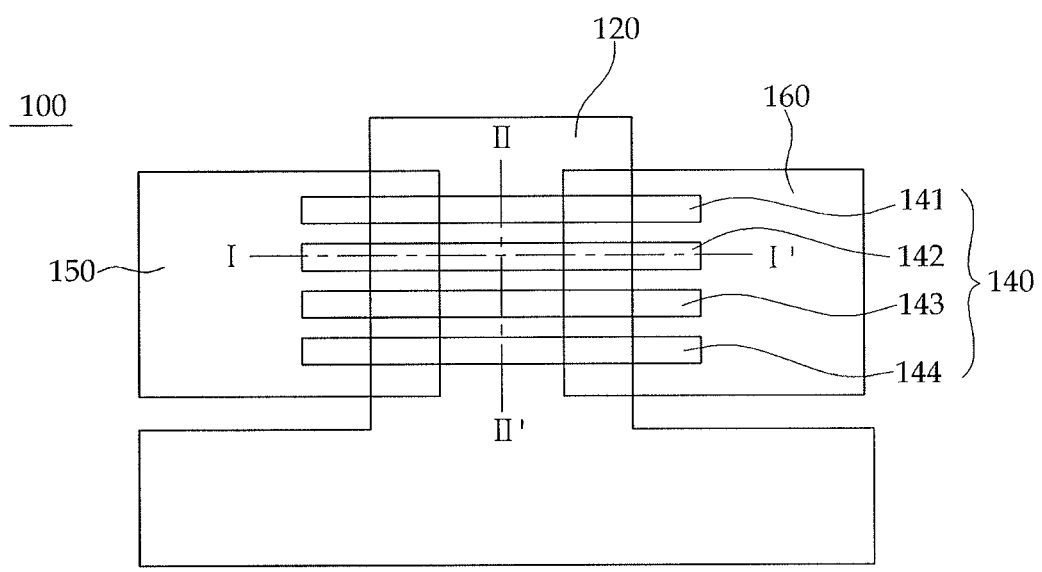
FIG. 1 illustrates a schematic plan view showing a comparative oxide semiconductor-based thin film transistor.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between," "directly between," "adjacent to," or "directly adjacent to," should be construed in the same way.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the relevant art.

It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Each element and its shape may be schematically or exaggeratedly illustrated to help the understanding thereof. Some elements provided for a real product may not be illustrated or may be omitted in the drawings or description. The drawings should be construed only to aid the understanding thereof. Throughout the drawings, the same reference numerals will refer to the same or like parts.

Figure 6:
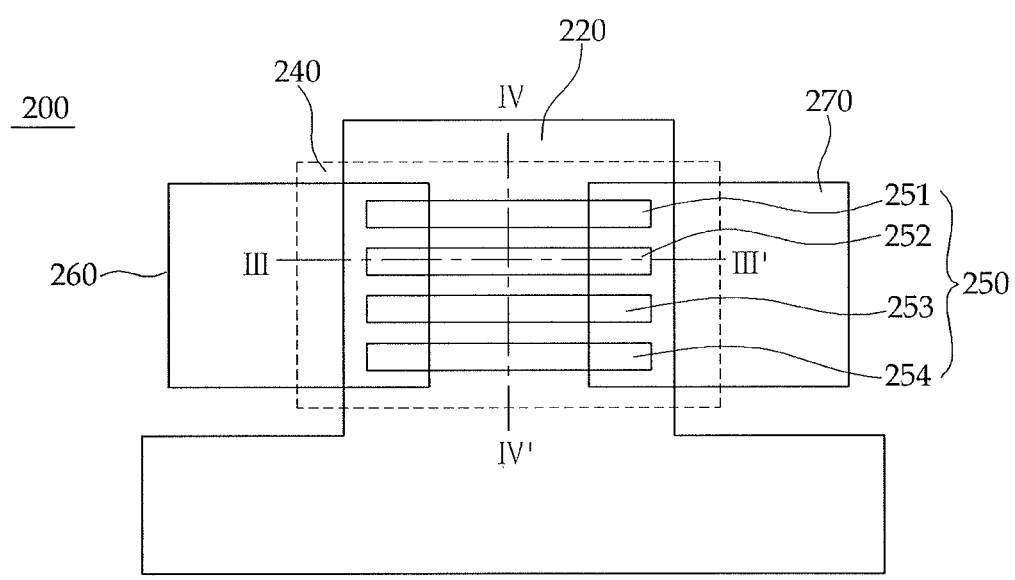
FIG. 6 illustrates a schematic plan view showing an oxide semiconductor-based thin film transistor according to an embodiment.
Figure 7:
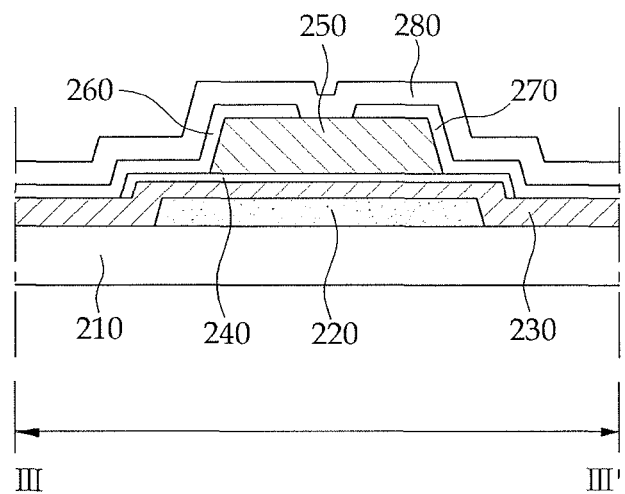
FIG. 7 illustrates a cross-sectional view taken along line III-III' in FIG. 6.
Figure 8:
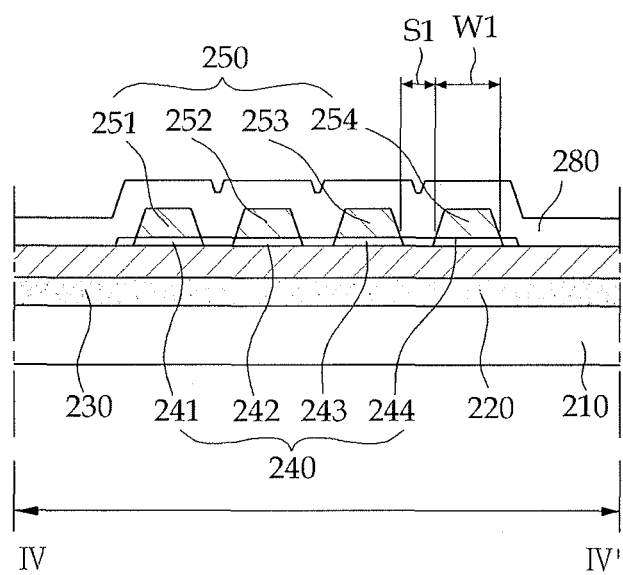
FIG. 8 illustrates a cross-sectional view taken along line IV-IV' in FIG. 6.

FIG. 6 illustrates a schematic plan view showing an oxide semiconductor-based thin film transistor according to an embodiment. FIG. 7 illustrates a cross-sectional view taken along line III-III' in FIG. 6. FIG. 8 illustrates a cross-sectional view taken along line IV-IV' in FIG. 6. In FIG. 6, some components of a thin film transistor, e.g., a gate insulating layer, are not illustrated for convenience's sake.

With reference to FIGS. 6 to 8, an oxide semiconductor-based thin film transistor 200 according to this embodiment includes a substrate 210, a gate electrode 220 on the substrate 210, a gate insulating layer 230 on the gate electrode 220, a semiconductor layer 240 which is disposed on the gate insulating layer 230 and overlaps at least a portion of the gate electrode 220, a plurality of etch stoppers 250 on the semiconductor layer 240, a source electrode 260 and a drain electrode 270 which are spaced apart from each other and disposed on the semiconductor layer 240 and the etch stoppers 250, and a planarization layer 280 on the source electrode 260 and the drain electrode 270.

The etch stopper 250 may be provided in plural. For ease of description, the plurality of etch stoppers 251, 252, 253, and 254 is collectively referred to as the etch stopper 250. Although the four etch stoppers 251, 252, 253, and 254 are illustrated in FIGS. 6 and 8, the number of etch stoppers may vary depending on the width of the semiconductor layer 240. An end portion of the etch stopper 250 may be connected to the source electrode 260 and the opposite end portion may be connected to the drain electrode 270.

With reference to FIG. 8, a plurality of channel regions may be defined in the semiconductor layer 240 by the plurality of etch stoppers 250 on the semiconductor layer 240. That is, the channel regions 241 are regions of the semiconductor layer that are beneath the etch stoppers 250.

The width of the channel region 241 may be substantially the same as a width W1 of the etch stopper 250, and a space between the channel regions 241 may be substantially the same as a space S1 between the etch stoppers 250.

The width W1 of the etch stopper 250 may be in a range of about 5 μm to about 30 μm. The space S1 between the etch stoppers 250 may be in a range of about 5 μm to about 30 μm. Similarly, the width of the channel region 241 may be in a range of about 5 μm to about 30 μm, and the space between the channel regions 241 may also be in a range of about 5 μm to about 30 μm.

In FIGS. 6 and 8, the etch stoppers 251, 252, 253, and 254 are illustrated as having the same width W1 and the same space S1 between the etch stoppers 251, 252, 253, and 254. In other implementations, the width, space, and number of the etch stoppers may vary.

Figure 9:
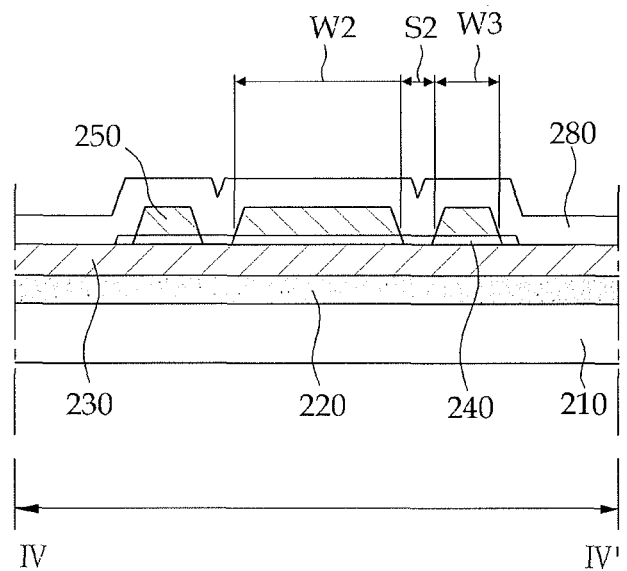
FIGS. 9 and 10 illustrate schematic cross-sectional views showing oxide semiconductor-based thin film transistors according to another embodiments.
Figure 10:
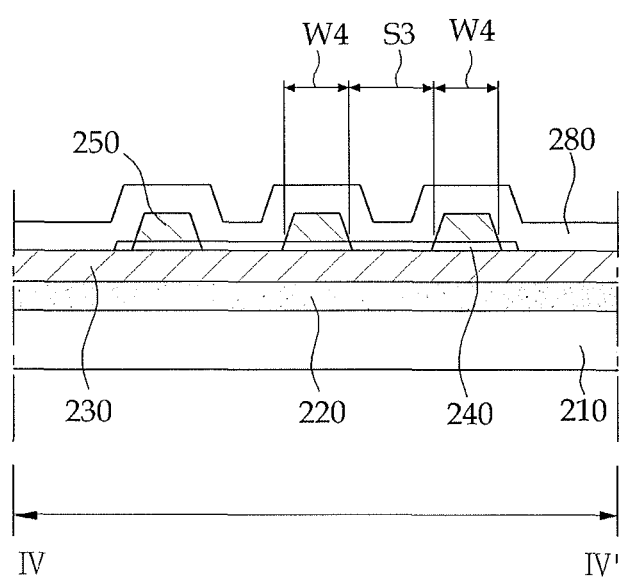

FIGS. 9 and 10 illustrate cross-sectional views depicting an oxide semiconductor-based thin film transistor according to other embodiments.

With reference to FIG. 9, an oxide semiconductor-based thin film transistor according to another embodiment may include a plurality of etch stoppers 250 with different widths W2 and W3.

With reference to FIG. 10, an oxide semiconductor-based thin film transistor according to yet another embodiment may have a plurality of etch stoppers 250 that are is different in width W4, space S3, and number from the thin film transistor illustrated in FIG. 8.

The substrate 210 may be made of glass, quartz, ceramic, or plastic. When the substrate 210 is a plastic substrate, a polyimide resin, an acrylic resin, a poly acrylate resin, a polycarbonate resin, a polyether resin, a polyethylene terephthalate resin, a sulfonic acid resin, etc. may be used. In other implementations, the substrate 210 may be a metallic substrate made of stainless steel.

The substrate 210 may further have a buffer layer disposed thereon. The buffer layer may be made of a silicon compound and may have a single layer or multilayer structure. The buffer layer may prevent invasion of foreign matters or moisture into the substrate 210 and may planarize the surface of the substrate 210. The buffer layer may be omitted, depending on kind of substrate or manufacturing process.

The gate electrode 220 may be made of an aluminum-based metal such as aluminum (Al) or an aluminum alloys, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), or titanium (Ti). The gate electrode 220 may have a multilayer structure in which two or more conductive layers that are physically or chemically different are laminated. The gate electrode 220 may be formed by coating a gate electrode-forming material on the entire surface and then patterning the coated material.

The gate insulating layer 230 may be disposed on the substrate which has the gate electrode 220 thereon. The gate insulating layer 230 may include, for example, silicon nitride ($SiN_x$), silicon oxide ($SiO_x$), hafnium oxide ($HfO_x$), aluminum oxide ($AlO_x$), yttrium oxide ($YO_x$), or tantalum oxide ($TaO_x$). These may be used singly or in combination. The gate insulating layer 230 may have a multilayer structure in which two or more insulating layers that are chemically or physically different are included.

The semiconductor layer 240 may be disposed on a region of the gate insulating layer 230 that corresponds to the gate electrode 220. The semiconductor layer 240 may be made of a semiconductor material such as amorphous silicon or polycrystalline silicon or, in other implementations, may made of an oxide semiconductor material.

In some embodiments illustrated in FIGS. 6 through 10, the semiconductor layer 240 may be an oxide semiconductor layer. The oxide semiconductor layer may include at least one element selected from the group of zinc (Zn), gallium (Ga), indium (In), and tin (Sn).

For example, the oxide semiconductor layer may be made of an oxide based on zinc (Zn), gallium (Ga), tin (Sn), or indium (In) or of a mixed oxide such as zinc oxide (ZnO), indium-gallium-zinc oxide (InGaZnO$_4$), indium-zinc oxide (In—Zn—O), or zinc-tin oxide (Zn—Sn—O).

For example, the oxide semiconductor layer may include an IGZO oxide containing indium (In), gallium (Ga), Zinc (Zn), and oxygen (O). In other implementations, the oxide semiconductor layer may include at least one metal oxide selected from the group \of In—Sn—Zn—O based metal oxides, In—Al—Zn—O based metal oxides, Sn—Ga—Zn—O based metal oxides, Al—Ga—Zn—O based metal oxides, Sn—Al—Zn—O based metal oxides, In—Zn—O based metal oxides, Sn—Zn—O based metal oxides, Al—Zn—O based metal oxides, In—O based metal oxides, Sn—O based metal oxides, and Zn—O based metal oxides.

The etch stopper 250, which is configured to divide the semiconductor layer 240 into an active region and an inactive region, may be disposed on the semiconductor layer 240. The etch stopper 250 may be made of an inorganic insulating material such as silicon nitride or silicon oxide, or of an organic insulating material. Further, the etch stopper 250 may have a multilayer structure including an inorganic layer and an organic layer so that the etch stopper 250 can protect the semiconductor layer 240 while having excellent insulation. The etch stopper 250 may have a thickness of about 5,000 Å or more. The thickness may be in a range of about 6,000 Å to about 8,000 Å.

The source electrode 260 and the drain electrode 270 may be disposed on the semiconductor layer 240 and the etch stopper 250. The source electrode 260 and drain electrode 270 may include a metal, a metal alloy, a metal nitride, a conductive metal oxide, or a transparent conductive material.

For example, the source electrode 260 and the drain electrode 270 may include at least one selected from the group of aluminum (Al), silver (Ag), tungsten (W), copper (Cu), nickel (Ni), chromium (Cr), molybdenum (Mo), titanium (Ti), platinum (Pt), tantalum (Ta), and alloys thereof, aluminum nitride (AlN$_x$), tungsten nitride (WN$_x$), chromium nitride (CrN$_x$), titanium nitride (TiN$_x$), tantalum nitride (TaN$_x$), zinc oxide (ZnO$_x$), indium tin oxide (ITO), tin oxide (SnO$_x$), indium oxide (InO$_x$), gallium oxide (GaO$_x$), and indium zinc oxide (IZO).

The planarization layer 280 may be disposed on the source electrode 260 and the drain electrode 270. The planarization layer 280 may include at least one selected from the group of a silicon nitride (SiN$_x$) layer, a silicon oxide (SiO$_x$) layer, a hafnium oxide (HfO$_x$) layer, an aluminum oxide (AlO$_x$) layer, a yttrium oxide (YO$_x$) layer, and a tantalum oxide (TaO$_x$) layer.

FIGS. 11 through 18 illustrate cross-sectional views depicting stages of a method of manufacturing a thin film transistor using an oxide semiconductor according to an embodiment.

The cross-sectional views of FIGS. 11 through 18 are taken along line III-III' or IV-IV' of FIG. 6. Among the cross-sectional views of FIGS. 11 through 18, the cross-sectional views tagged with III-III' are obtained by transversely sectioning the thin film transistor 200 in FIG. 6, and the cross-sectional views tagged with IV-IV' are obtained by longitudinally sectioning the thin film transistor 200 in FIG. 6.

Figure 11:
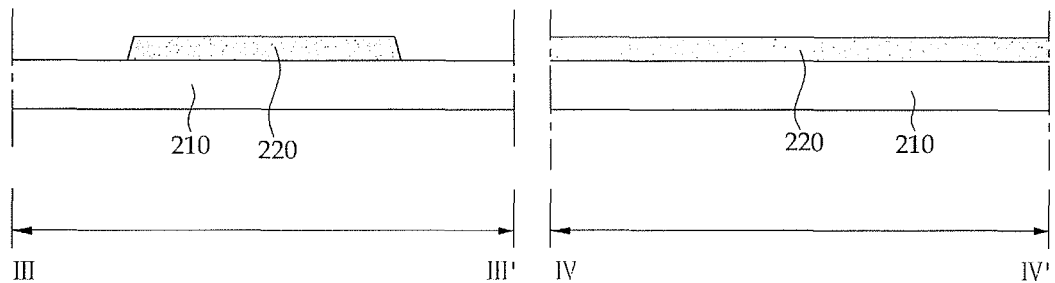
FIGS. 11 through 18 illustrate cross-sectional views depicting stages of a method of manufacturing an oxide semiconductor-based thin film transistor according to an embodiment.

With reference to FIG. 11, a gate electrode 220 may be formed on a substrate 210 formed of glass or plastic. The gate electrode 220 may be formed by coating a gate electrode-forming material on the substrate 210 and then patterning the coated material.

Figure 12:
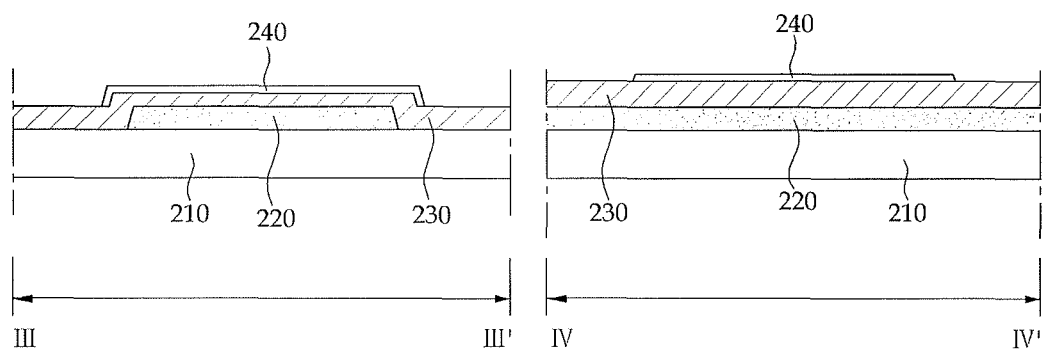

With reference to FIG. 12, a gate insulating layer 230 formed of silicon nitride (SiN$_x$), silicon oxide (SiO$_x$), etc. may be formed on the entire surface of the substrate 210 including the gate electrode 220. The gate insulating layer 230 may have a multilayer structure including two or more insulating layers that physically or chemically differ. The gate insulating layer 230 may be formed by using a chemical vapor deposition process, a spin coating process, a sputtering process, a vacuum deposition process, or a printing process.

A semiconductor layer 240 may be formed by coating a semiconductor layer-forming material on the gate insulating layer 230 and patterning the coated material such that the material remains in an area corresponding to the gate electrode 220. The semiconductor layer-forming material may be a silicon-based semiconductor material such as a-Si and poly-Si, or an oxide semiconductor material.

When the semiconductor layer-forming material is an oxide semiconductor material, the oxide semiconductor material may include at least one selected from the group of zinc (Zn), gallium (Ga), indium (In), and tin (Sn).

Figure 13:
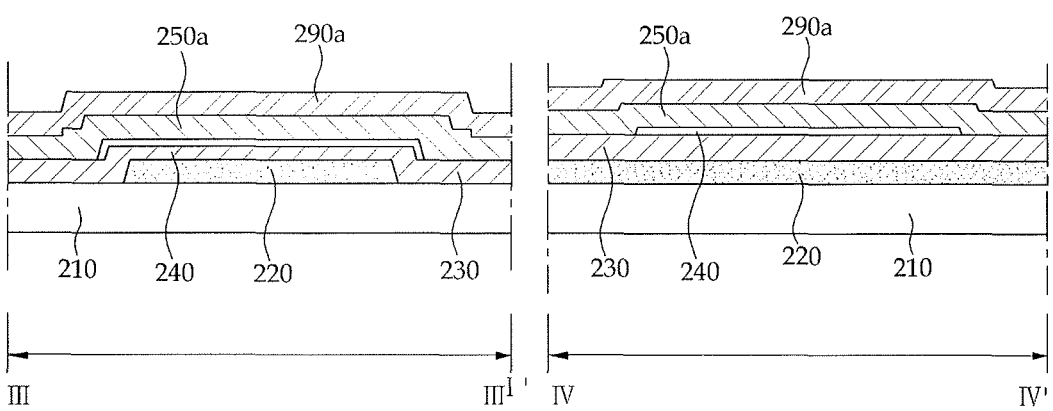

With reference to FIG. 13, an etch stopper 250 may be formed on the semiconductor layer 240.

To obtain the etch stoppers 250, an etch stopper-forming material 250a may be coated on the entire substrate, which has the semiconductor layer 240 thereon. The etch stopper-forming material 250a may be formed of an inorganic insulating material such as silicon nitride and silicon oxide, or an organic insulating material. The etch stopper-forming material 250a may have a multilayer structure including an inorganic layer and an organic layer. A suitable photoresist 290a may be coated on the etch stopper-forming material 250a.

Figure 14:
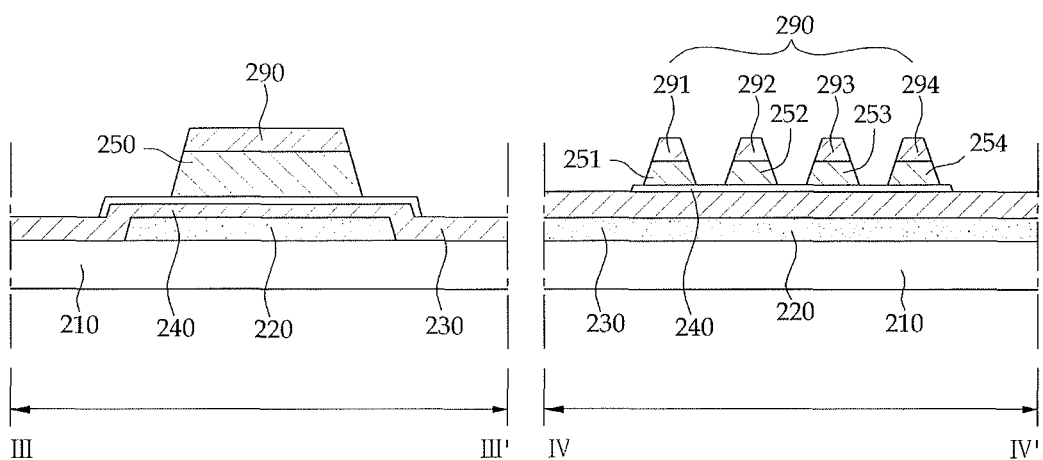

With reference to FIG. 14, selective exposure may be performed on the photoresist 290a by using a mask. Etching may then performed, thereby forming the etch stopper 250 and a photoresist pattern 290.

Figure 15:
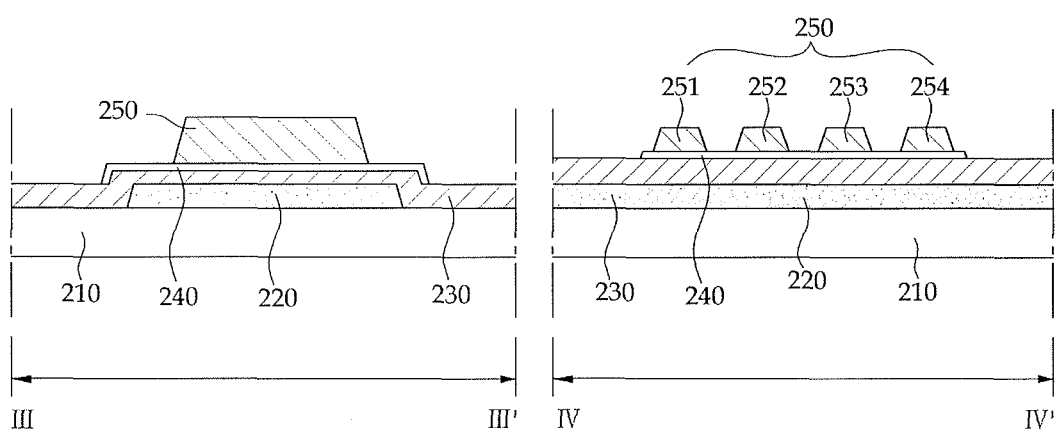

With reference to FIG. 15, the photoresist pattern 290 remaining on the etch stopper 250 may be removed therefrom so that only the etch stopper 250 remains on the semiconductor layer 240.

Figure 16:
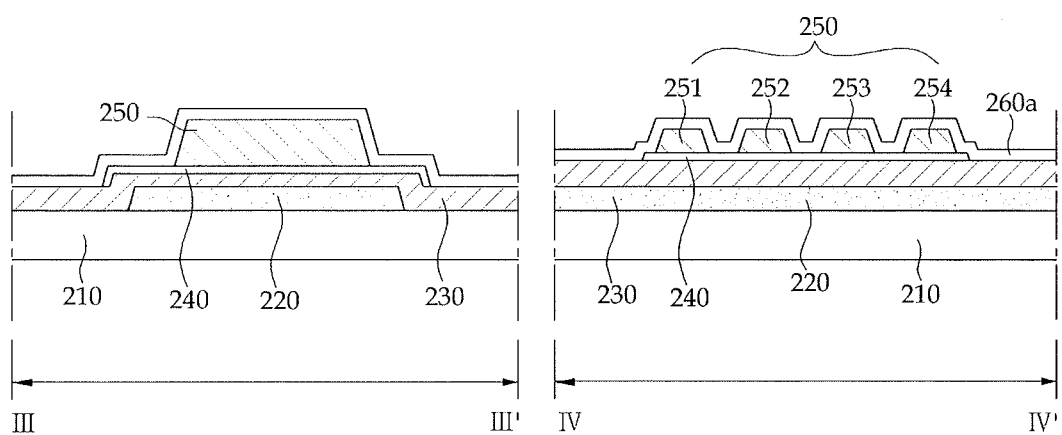

With reference to FIG. 16, an electrode-forming material may be coated on the substrate, which has the etch stopper 250 thereon.

Figure 17:
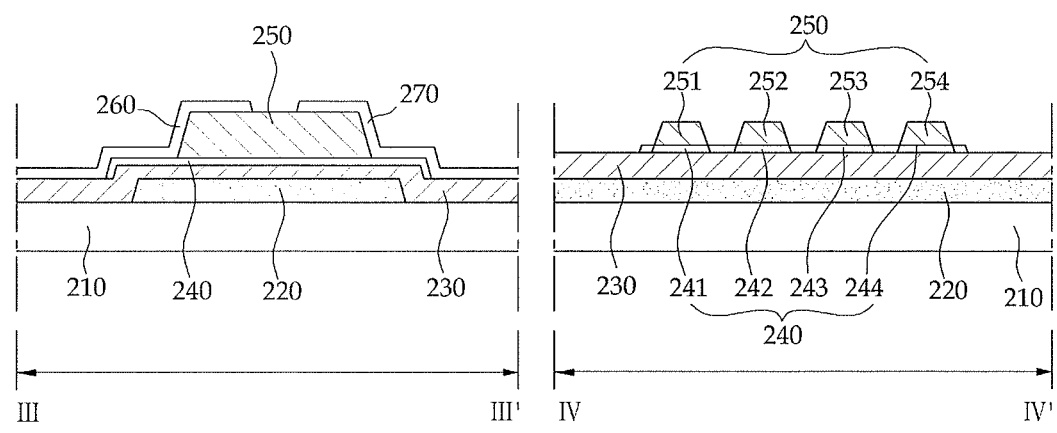

With reference to FIG. 17, the electrode-forming material coated on the substrate may be patterned to form a source electrode 260 and a drain electrode 270. The electrode-forming material may be patterned using a dry etching process. In this case, a surface of the semiconductor layer 240 where the etch stopper 250 is not formed may be damaged or removed by plasma. As a result, the semiconductor layer 240 that remains under a plurality of etch stoppers may be divided into a plurality of channel regions 241, 242, 243, and 244.

Figure 18:
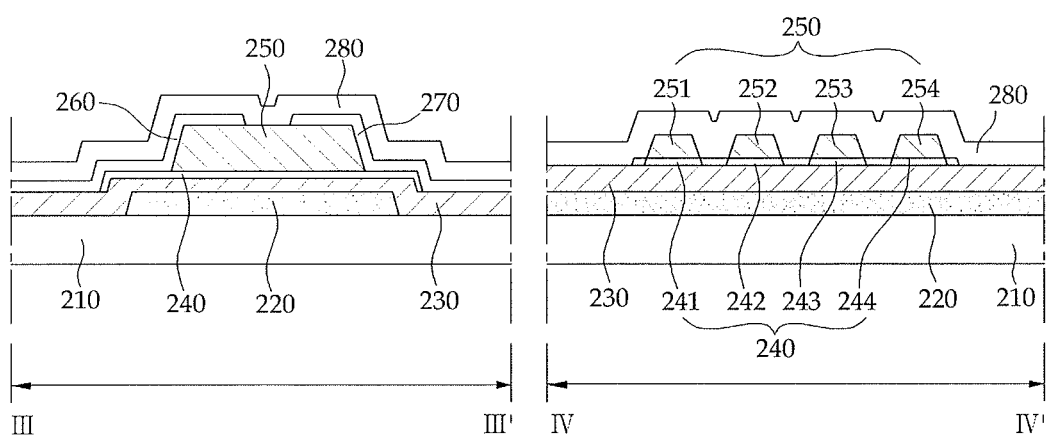

With reference to FIG. 18, a planarization layer 280 is formed on the substrate 210 which has the source electrode 260 and drain electrode 270 thereon. The planarization layer 280 may be formed of a silicon oxide, a silicon nitride, a silicon oxynitride, a silicon carbonitride, a silicon oxycarbide. These substances may be used alone or in combination. The planarization layer 280 may be formed by using a chemical vapor deposition process, a spin coating process, a sputtering process, a vacuum deposition process, or a printing process By way of summation and review, thin film transistors that drive display devices may be categorized into amorphous silicon (a-Si) transistors, polycrystalline silicon (poly-Si) transistors, and amorphous oxide semiconductor (AOS) transistors, according to the material that forms a semiconductor layer used for the thin film transistor.

A-Si has advantages of being amorphous, but has disadvantages such as slow charge mobility and low stability.

Poly-Si has advantages of fast charge mobility and high stability but has disadvantages of involving difficult manufacturing process conditions, such as a high temperature at which the poly-Si is formed, which makes forming a poly-Si layer on a flexible substrate such as a plastic substrate difficult.

AOS has advantages of faster charge mobility than a-Si and a lower process temperature than poly-Si.

Figure 4:
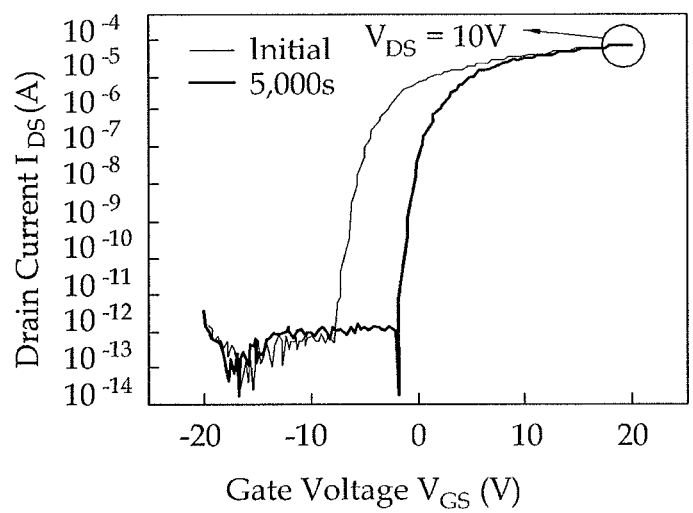
FIG. 4 illustrates a graph showing a change in threshold voltage of a thin film transistor including an oxide semiconductor before and after application of voltage stress to the thin film transistor.
Figure 5:
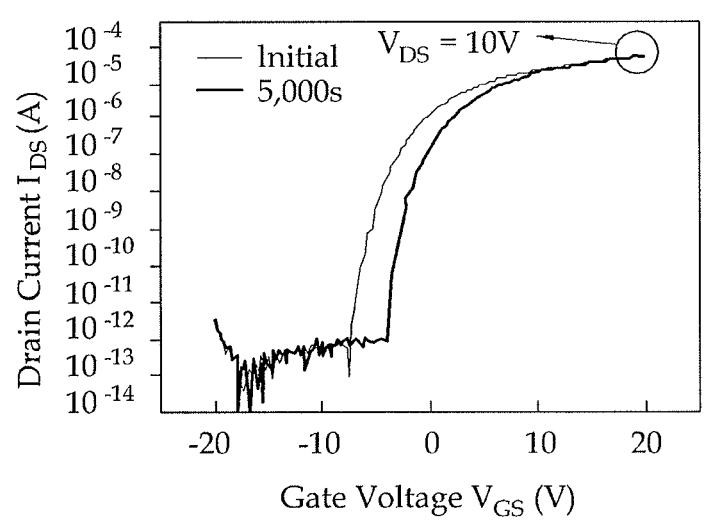
FIG. 5 illustrates a graph showing a change in threshold voltage of a thin film transistor including a plurality of oxide semiconductors before and after application of voltage stress to the thin film transistor.

FIG. 4 illustrates a graph showing a change in threshold voltage of a thin film transistor including an oxide semiconductor before and after application of voltage stress to the thin film transistor. FIG. 5 illustrates a graph showing a change in threshold voltage of a thin film transistor including a plurality of oxide semiconductors, as illustrated in FIG. 1, before and after application of voltage stress to the thin film transistor.

Specifically, FIG. 4 is a graph showing threshold voltages of a thin film transistor including an oxide semiconductor with a single channel having a channel width of about 32 μm before voltage stress of 10 V (VDS) is applied to the thin film transistor (refer to a line tagged with "initial") and after voltage stress of 10 V (VDS) is applied to the thin film transistor (refer to a line tagged with "5,000 s"), respectively. FIG. 5 is a graph showing threshold voltages of a thin film transistor including an oxide semiconductor with four channels each having a channel width of about 8 μm before voltage stress of 10 V (VDS) is applied to the thin film transistor (refer to a line tagged with "initial") and after voltage stress of 10 V (VDS) is applied to the thin film transistor (refer to a line tagged with "5000 s"), respectively.

With reference to FIGS. 4 and 5, the thin film transistor based on the oxide semiconductor with a plurality of channels better maintains its threshold voltage than the thin film transistor based on the oxide semiconductor with a single channel. That is, the multi-active thin film transistor is improved in electric characteristics, compared to the single-active thin film transistor.

Figure 2:
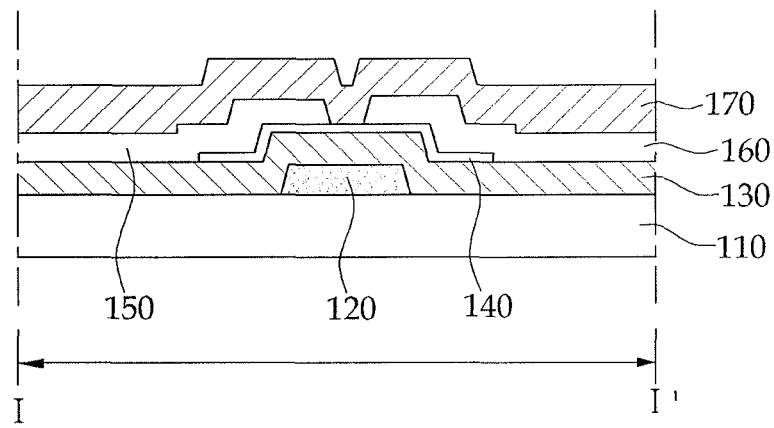
FIG. 2 illustrates a cross-sectional view taken along line I-I' in FIG. 1.
Figure 3:
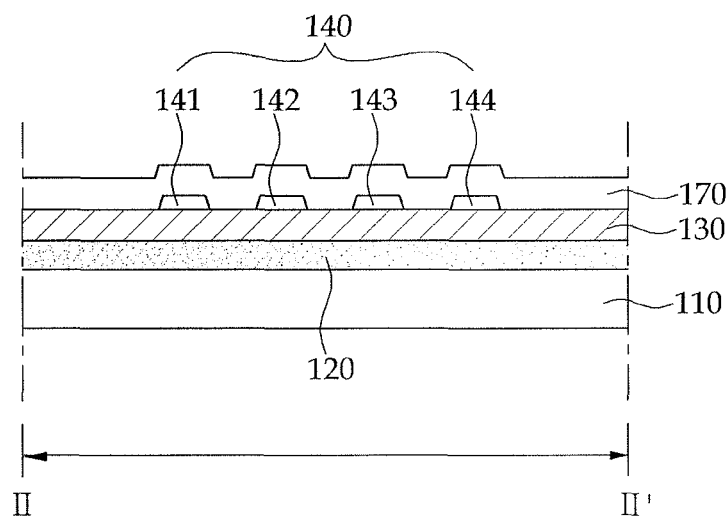
FIG. 3 illustrates a cross-sectional view taken along line II-II' in FIG. 1.

FIG. 1 illustrates a schematic plan view showing a comparative example oxide semiconductor-based thin film transistor. FIG. 2 illustrates a cross-sectional view taken along line I-I' in FIG. 1. FIG. 3 illustrates a cross-sectional view taken along line II-II' in FIG. 1.

With reference to FIGS. 1 to 3, a comparative example oxide semiconductor-based thin film transistor 100 includes a substrate 110, a gate electrode 120 on the substrate 110, a gate insulating layer 130 on the gate electrode 120, a semiconductor layer 140 which is disposed on the gate insulating layer 130 and overlaps at least a portion of the gate electrode 120, and a source electrode 150 and a drain electrode 160 which are distanced from each other and disposed on the semiconductor layer 140, and a planarization layer 170 on the source electrode 150 and the drain electrode 160.

The semiconductor layer 140 is an oxide semiconductor layer. The oxide semiconductor layer is made of an oxide based on zinc (Zn), gallium (Ga), tin (Sn), or indium (In) or of a mixed oxide such as zinc oxide (ZnO), indium-gallium-zinc oxide (InGaZnO$_4$), indium-zinc oxide (In—Zn—O), and zinc-tin oxide (Zn—Sn—O).

The semiconductor layer 140 has a multi-active structure having a plurality of channels 141, 142, 143, and 144. The thin film transistor with the plurality of channels has improved electric characteristics, compared to a thin film transistor with a single channel.

As illustrated in FIG. 1, the channel region of the thin film transistor 100 is exposed between the source electrode and the drain electrode. This structure is called a Back Channel Etch (BCE) structure. With such a structure, manufacturing the thin film transistor may be difficult due to non-uniformity in back channel etching, which may be attributable to endemic characteristics of the BCE structure.

In the case where the source and drain electrodes are wet etched by using an acid solution, since the oxide semiconductor which is susceptible to an acid solution is likely to be dissolved by a wet etching solution, it may be difficult to control the etching selectivity of the source electrode and the drain electrode with respect to the oxide semiconductor.

When patterning the source and drain electrodes through a dry etching process, the surface of the oxide semiconductor may be damaged due to plasma.

Accordingly, in order to manufacture the oxide semiconductor-based thin film transistor, a technology that enables patterning of an oxide semiconductor and an etching technology which secures high etching selectivity between the oxide semiconductor and the source/drain electrodes are desirable.

According to embodiments disclosed above with respect to FIGS. 6 to 18, a thin film transistor may have a plurality of etch stoppers on a semiconductor layer to prevent or reduce the likelihood of damage during the patterning of the oxide semiconductor and such that electric reliability can be improved. By using a plurality of etch stoppers, the thin film transistor may have the same advantages as a thin film transistor with multiple channels.

According to embodiments, the thin film transistor using the oxide semiconductor may have high mobility of charges, satisfies constant current test standards, and secures uniform electric characteristics, so that the thin film transistor can be applied to display devices such as a liquid crystal display device and an organic light emitting display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A thin film transistor, comprising:
   a gate electrode on a substrate;
   a gate insulating layer on the gate electrode;
   a semiconductor layer on the gate insulating layer, the semiconductor layer overlapping at least a portion of the gate electrode;
   a plurality of etch stoppers on the semiconductor layer, and
   a source electrode and a drain electrode, which are spaced apart from each other and disposed on the etch stoppers and the semiconductor layer,
   wherein a plurality of channel regions are defined in the semiconductor layer by the plurality of etch stoppers on the semiconductor layer, a width of each channel region being substantially the same as a width of a corresponding one of the etch stoppers, and a space between adjacent ones of the channel regions being substantially the same as a space between corresponding adjacent ones of the etch stoppers, and
   wherein portions of the semiconductor layer overlapped by the plurality of etch stoppers are not damaged and portions of the semiconductor layer not overlapped by the plurality of etch stoppers are damaged.

2. The thin film transistor as claimed in claim 1, wherein:
   one end portion of each etch stopper is connected to the source electrode such that the one end portion of the etch stopper is between the source electrode and a respective one of the channel regions,
   the source electrode directly contacts one portion of the semiconductor layer not covered by an etch stopper,
   an opposite end portion of each etch stopper is connected to the drain electrode such that the opposite end portion of each etch stopper is between the drain electrode and the respective one of the channel regions, and
   the drain electrode directly contacts an opposite portion of the semiconductor layer not covered by an etch stopper.

3. The thin film transistor as claimed in claim 1, wherein the channel region is a region of the semiconductor layer that is centered under the etch stopper.

4. The thin film transistor as claimed in claim 1, wherein the etch stopper has a width in a range of about 5 μm to about 30 μm.

5. The thin film transistor as claimed in claim 1, wherein a space between the etch stoppers is in a range of about 5 μm to about 30 μm.

6. The thin film transistor as claimed in claim 1, wherein the semiconductor layer is an oxide semiconductor layer.

7. The thin film transistor as claimed in claim 6, wherein the oxide semiconductor layer includes at least one selected from the group of zinc (Zn), gallium (Ga), indium (In), and tin (Sn).

8. The thin film transistor as claimed in claim 6, wherein the oxide semiconductor layer includes indium (In), gallium (Ga), zinc (Zn), and oxygen (O).

9. A method of manufacturing a thin film transistor, the method comprising:
   forming a gate electrode on a substrate;
   forming a gate insulating layer covering the gate electrode;
   forming a semiconductor layer overlapping at least a portion of the gate electrode;
   forming a plurality of etch stoppers on at least a portion of the semiconductor layer; and
   forming an electrode-forming material on the substrate and patterning the electrode-forming material to form a source electrode and a drain electrode spaced apart from each other and disposed on the semiconductor layer and the etch stoppers, wherein during the patterning of the electrode-forming material, portions of the semiconductor layer exposed between the plurality of etch stoppers are removed or damaged and portions of the semiconductor layer on which the plurality of etch stoppers are formed are not removed or damaged.

10. The method as claimed in claim 9, wherein:
    one end portion of the etch stopper is directly connected to the source electrode such that the one end portion of the etch stopper is between the source electrode and a respective one of the channel regions, and
    an opposite end portion of the etch stopper is directly connected to the drain electrode such that the opposite end portion of each etch stopper is between the drain electrode and the respective one of the channel regions.

11. The method as claimed in claim 9, wherein the plurality of etch stoppers define a plurality of channel regions in the portions of the semiconductor layer on which the plurality of etch stoppers are formed, wherein a width of each channel region is substantially the same as a width of a corresponding one of the etch stoppers, and a space between adjacent ones of the channel regions is substantially the same as a space between corresponding adjacent ones of the etch stopper.

* * * * *